United States Patent
Hu et al.

(10) Patent No.: US 10,410,716 B2
(45) Date of Patent: Sep. 10, 2019

(54) CROSSBAR ARRAYS FOR CALCULATING MATRIX MULTIPLICATION

(71) Applicant: Hewlett Packard Enterprise Development LP, Houston, TX (US)

(72) Inventors: Miao Hu, Palo Alto, CA (US); Zhiyong Li, Foster City, CA (US); John Paul Strachan, San Carlos, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 16 days.

(21) Appl. No.: 15/570,980

(22) PCT Filed: Sep. 25, 2015

(86) PCT No.: PCT/US2015/052262
§ 371 (c)(1),
(2) Date: Oct. 31, 2017

(87) PCT Pub. No.: WO2017/052598
PCT Pub. Date: Mar. 30, 2017

(65) Prior Publication Data
US 2018/0350433 A1   Dec. 6, 2018

(51) Int. Cl.
*G11C 13/00* (2006.01)
*G06G 7/16* (2006.01)
*G11C 5/05* (2006.01)

(52) U.S. Cl.
CPC .......... *G11C 13/0007* (2013.01); *G06G 7/16* (2013.01); *G11C 5/05* (2013.01); *G11C 13/003* (2013.01); *G11C 13/0023* (2013.01); *G11C 13/0069* (2013.01); *G11C 2213/79* (2013.01)

(58) Field of Classification Search
CPC ... G11C 13/0007; G11C 5/05; G11C 13/0023; G11C 13/003; G11C 13/0069; G06F 7/16
USPC .......................................................... 365/148
See application file for complete search history.

(56) References Cited

U.S. PATENT DOCUMENTS

| | | | |
|---|---|---|---|
| 6,687,147 B2 * | 2/2004 | Fricke | G11C 5/025 257/E21.614 |
| 7,800,095 B2 | 9/2010 | An et al. | |
| 8,385,112 B2 | 2/2013 | Liu | |
| 8,587,079 B2 | 11/2013 | Cambou et al. | |

(Continued)

OTHER PUBLICATIONS

Fan, D.; et al.; "Hierarchical Temporal 9-12 Memory Based on Spin-Neurons and Resistive Memory for Energy-Efficient Brain-Inspired Computing"; Aug. 14, 2015, pp. 1907-1919.

(Continued)

*Primary Examiner* — Xiaochun L Chen
(74) *Attorney, Agent, or Firm* — Hewlett Packard Enterprise Patent Department

(57) ABSTRACT

A crossbar array, comprises a plurality of row lines, a plurality of column lines intersecting the plurality of row lines at a plurality of intersections, a plurality of junctions coupled between the plurality of row lines and the plurality of column lines at a portion of the plurality of intersections, and a plurality of diagonal control lines coupled to the plurality of junctions. Each junction comprises a resistive memory element and a transistor, and the junctions are positioned to calculate a matrix multiplication of a first matrix and a second matrix.

13 Claims, 6 Drawing Sheets

(56) References Cited

U.S. PATENT DOCUMENTS

| | | | |
|---|---|---|---|
| 9,466,362 B2* | 10/2016 | Yu | G11C 13/0026 |
| 2008/0237886 A1 | 10/2008 | Wu et al. | |
| 2010/0091557 A1 | 4/2010 | Hidaka | |
| 2010/0097841 A1* | 4/2010 | Lu | G11C 11/56 |
| | | | 365/148 |
| 2011/0267866 A1 | 11/2011 | Carter et al. | |
| 2013/0039111 A1 | 2/2013 | Perner | |
| 2013/0135925 A1* | 5/2013 | Scheuerlein | G11C 13/0004 |
| | | | 365/163 |
| 2013/0250648 A1* | 9/2013 | Parkinson | G11C 13/0023 |
| | | | 365/145 |
| 2014/0172937 A1 | 7/2014 | Linderman et al. | |
| 2016/0049195 A1* | 2/2016 | Yu | G11C 13/0026 |
| | | | 365/63 |

OTHER PUBLICATIONS

Gu, P. et al., Technological Exploration of RRAM Crossbar Array for Matrix-vector Multiplication, (Research Paper), Jan. 19-22, 2015, 6 Pages.

International Searching Authority, The International Search Report and the Written Opinion, PCT/US2015/052262, dated Jul. 22, 2016, 12 Pgs.

* cited by examiner

CROSSBAR ARRAYS FOR CALCULATING MATRIX MULTIPLICATION

BACKGROUND

Memristors are devices that can be programmed to different resistive states by applying a programming energy, such as a voltage. Large crossbar arrays of memory devices with memristors can be used in a variety of applications, including memory, programmable logic, signal processing control systems, pattern recognition, and other applications.

Convolution is a mathematical operation on two functions that produces a third function that is typically viewed as a modified version of one of the original functions. Convolution has applications that include image processing, probability, statistics, computer signal processing, electrical engineering, and differential equations.

BRIEF DESCRIPTION OF THE DRAWINGS

The following detailed description references the drawings, wherein.

DETAILED DESCRIPTION

Figure 1:
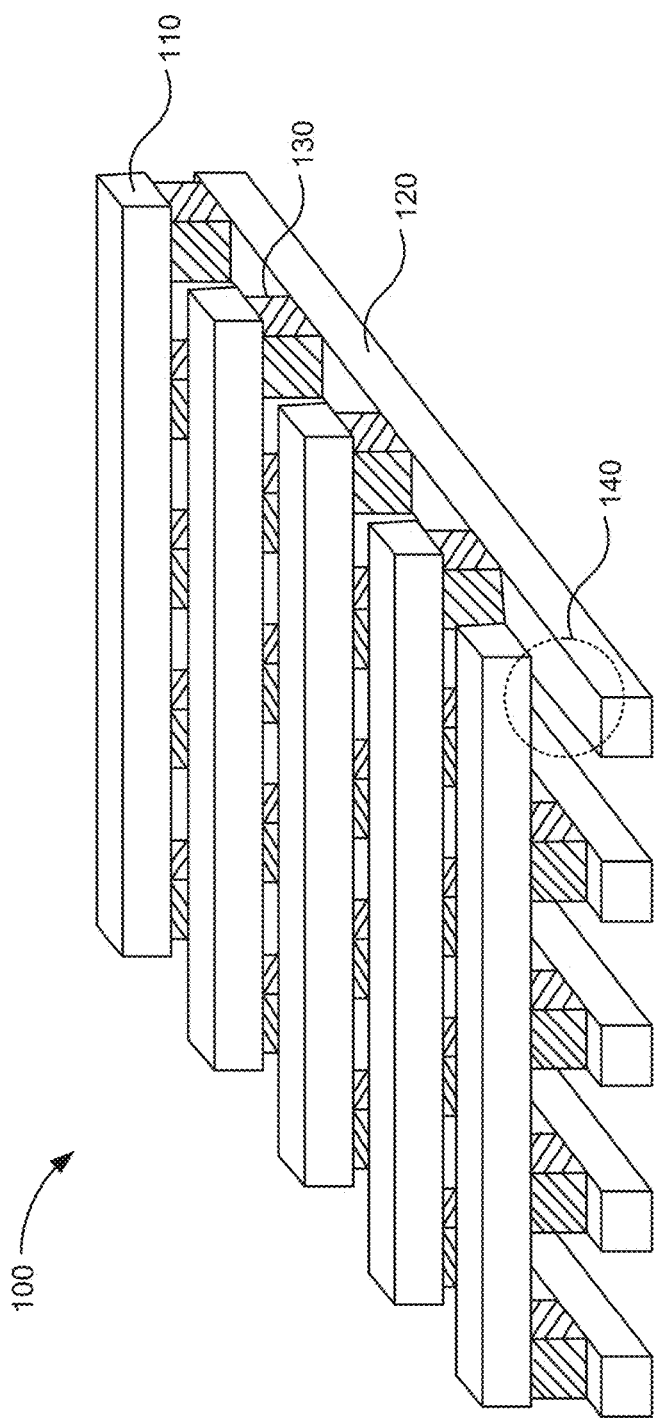
FIG. 1 is a diagram of an example crossbar array.

Convolution is a mathematical operation on two functions that produces a third function that is typically viewed as a modified version of one of the original functions. Convolution is used in some image processing techniques, including the convolution of an image and a kernel matrix. The image and the kernel may be mapped to matrices, on which matrix multiplication may be calculated. However, convolution may be one of the most computation-intensive parts of the image processing technique. Furthermore, the equivalent matrices may be too large and too sparsely mapped for hardware implementation.

Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on".

In some applications, a memory crossbar array can be used to perform matrix computations. For example, an input voltage signal from each row of the crossbar is weighted by the conductance of the resistive devices in each column and accumulated as the current output from each column. Ideally, if wire resistances can be ignored, the current, I, flowing out of the crossbar array will be approximately $I^T=V^TG$, where V is the input voltage and G is the conductance matrix, including contributions from each memristor in the crossbar array. The use of memristors at junctions or crosspoint of the crossbar array enables programming the resistance (or conductance) at each such junction corresponding to the values of G. The input voltage values may be mapped to a matrix.

Examples disclosed herein provide for 1-transistor 1-memory crossbar arrays for calculating matrix multiplication. Example crossbar arrays may include a plurality of row lines, a plurality of column lines intersecting the plurality of row lines at a plurality of intersections, a plurality of junctions coupled between the row lines and the columns at a portion of the plurality of intersections, and a plurality of diagonal control lines coupled to the plurality of junctions. Each junction may have a transistor and a resistive memory element such as a memristor, and the junctions are positioned to calculate a matrix multiplication of a first matrix and a second matrix. For example, a first matrix may be reshaped into a vector, and the matrix multiplication can be converted into vector-matrix multiplication. Junctions may not need to be positioned at intersections where the second matrix may have values of zero. Furthermore, a single diagonal control line may be coupled to all junctions in a particular diagonal in the crossbar array. In this manner, space can be saved for placing driving and sensing circuitry to minimize device size.

Referring now to the figures, FIG. 1 illustrates an example crossbar array 100. Crossbar array 100 may be a configuration of parallel and perpendicular lines with junctions coupled between lines at intersections. Crossbar array 100 may include a plurality of row lines 110, a plurality of column lines 120, and a plurality of junctions 130. Each junction may be coupled between a unique combination of one row line and one column line. In other words, no memory cells share both a row line and a column line. It should be noted that FIG. 1 shows an example crossbar structure. With appropriate additional structures, crossbar array 100 may be used in a variety of applications, including for matrix multiplication as described herein.

Row lines 110 may be electrodes that carry current through crossbar array 100. In some examples, row lines 110 may be parallel to each other, generally with equal spacing. Row lines 110 may sometimes be referred to as bit lines. Depending on orientation, row lines 110 may alternatively be referred to as word lines. Similarly, column lines 120 may be electrodes that run nonparallel to row lines 110. Column lines 120 may be referred to as word lines in some conventions. In other orientations, column lines 120 may refer to bit lines. Row lines 110 and column lines 120 may serve as electrodes that deliver voltage and current to the junctions 130. Example materials for row lines 110 and column lines 120 may include conducting materials such as Pt, Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, Ti$_5$Si$_3$, TaSi$_2$, WSi$_2$, NbSi$_2$, V$_3$Si, electrically doped polycrystalline Si, electrically doped polycrystalline Ge, and combinations thereof.

Junctions 130 may be coupled between row lines 110 and column 120 at a portion of the plurality of intersections. For example, junctions 130 may be positioned to calculate a matrix multiplication of a first matrix and a second matrix. Although not directly illustrated in FIG. 1, junctions 130 may, in some examples, be formed at some of the intersections and not at some of the other intersections, leaving an open circuit (no current flow) at such junctions. In other words, some of the intersections do not have a junction 130. The positioning of junctions 130 to calculate matrix multiplication is further described in relation to FIG. 2.

Each junction 130 may comprise a resistive memory element. A resistive memory element may have a resistance that changes with an applied voltage or current. Furthermore, in some examples, the resistive memory element may "memorize" its last resistance. In this manner, each resistive memory element may be set to at least two states. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, such as in examples herein, memristors may be linear in voltage ranges of interest. A voltage range of interest may be, for example, the range of voltages used in the operation of crossbar array 100.

In examples, the memristive memory element may include other components, such as transistors and/or selectors. A transistor may serve as a switch with an "on" and "off" state that determines whether a signal can pass through the junction. Similarly, a selector may be an electrical device that may be used in memristor devices to provide desirable electrical properties, such as switching. For example, a selector may be a 2-terminal device or circuit element that admits a current that depends on the voltage applied across the terminals. Furthermore, in some examples, a selector may be coupled in series with memristors at junctions 130.

In some examples, not all of the intersections of row lines and column lines will have a junction 130. In other words, some of the intersections may have a junction 130 having a resistive memory element and a transistor coupled in series. Junctions 130 may be positioned to calculate a matrix multiplication of two matrices. Intersections of row lines 110 and column lines 120 that may not be used for a matrix multiplication may not have a junction, as shown in FIG. 1 by 140.

Figure 2:
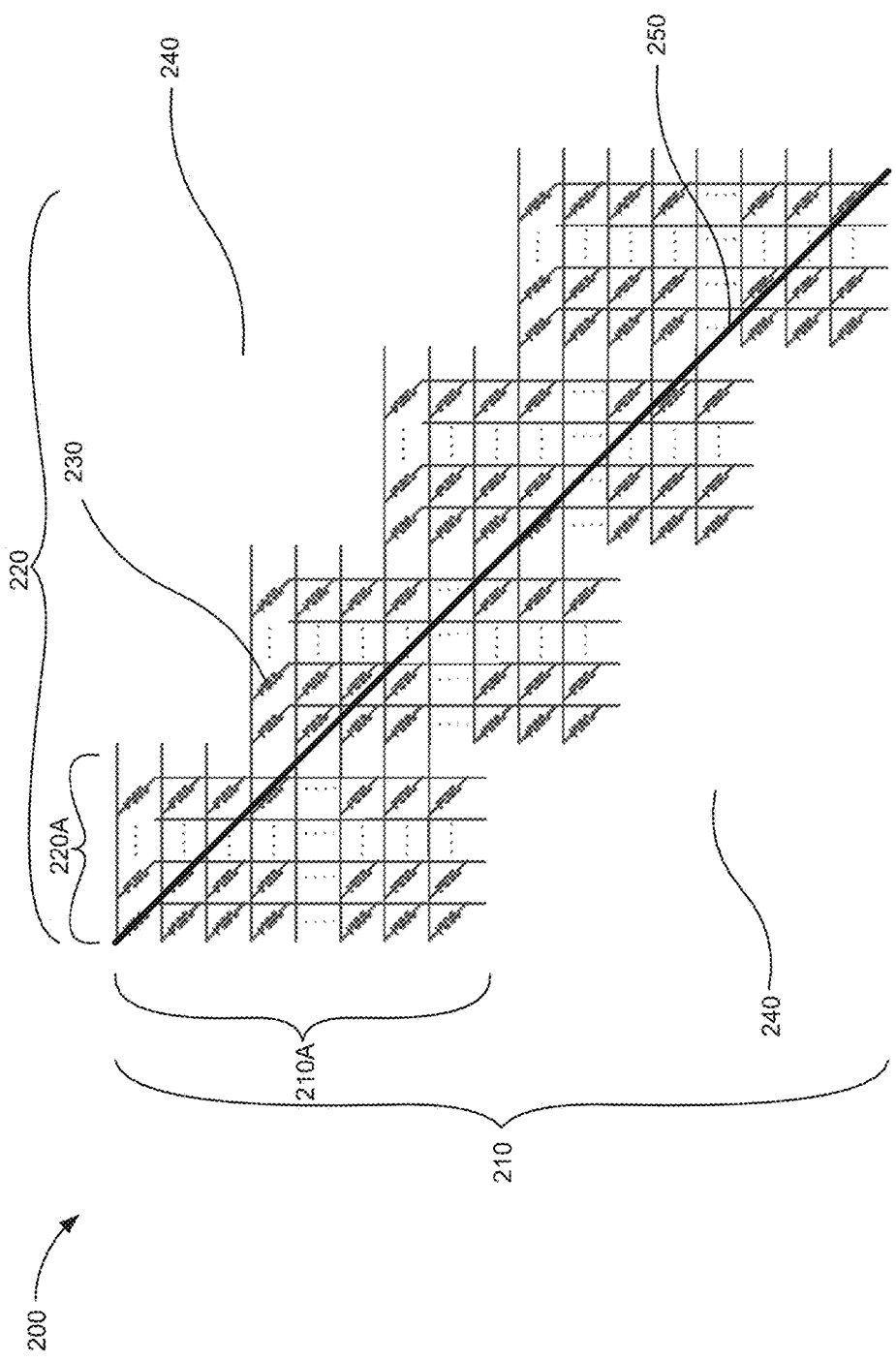
FIG. 2 is a diagram of an example crossbar array for calculating matrix multiplication.

FIG. 2 illustrates an example crossbar array 200 for calculating a convolution of an image and a kernel. Crossbar array 200 may be analogous to crossbar array 100 of FIG. 1, and may be a part of an image processor, for example. Crossbar array 200 may include a plurality of row lines 210 analogous to row lines 110, a plurality of column lines 220 analogous to column lines 120, a plurality of junctions 230 analogous to junctions 130, and a plurality of diagonal control lines 250.

In some examples, each diagonal control line 250 may be coupled to all of the junctions 230 in a diagonal of the crossbar array 200. Diagonal control lines 250 may be conducting electrodes that deliver a voltage, such as a voltage for activating the transistors in junctions 230. Diagonal control lines 250 may be similar to row lines 110 and column lines 120 of crossbar array 100 of FIG. 1A and may have a variety of electrically conducting materials.

Crossbar array 200 may calculate a convolution of a two-dimensional image and a two-dimensional kernel. Crossbar array 200 may do so by calculating a matrix multiplication of a first matrix that corresponds to the image and of a second matrix that corresponds to the kernel. In some examples, junctions 230 may be positioned so that they couple intersections of row lines 210 and column lines 220 in a manner that allows crossbar array 200 to calculate the matrix multiplication of the first matrix and the second matrix.

For example, junctions 230 may be positioned at intersections of crossbar array 200 that represent the junctures of the first matrix and the second matrix. In other words, junctions may not be built at the intersections of the crossbar array where the value assigned to a junction would always be zero. This may leave open spaces within the crossbar array, as shown by 240 in FIG. 2. The open spaces 240 may be used, for example, to house driving and sensing circuitry to minimize size of crossbar array 200. Driving and sensing circuits are described in further detail in relation to FIG. 4.

To calculate the matrix multiplication, crossbar array 200 may receive a first plurality of programming signals at the resistive memory elements. The first plurality of programming signals may define a number of values to be applied to the resistive memory elements. In some examples, the first matrix corresponds to the kernel for processing the image. For example, the kernel matrix may be useful for blurring, sharpening, embossing, edge-detection, and other image processes. The first plurality of programming signals may write the resistive memory elements to a certain state to correspond to certain values in the first matrix. For example, a resistive memory element may be set to a plurality of resistance states. Driving an input current, such as by applying a voltage defined by a second matrix, across the crossbar array could transform the input current to an output current. Similarly, desired junctions 230 may be activated by the delivery of a gate voltage to the transistors of the desired junctions via diagonal control lines 250.

Additionally, crossbar array 200 may receive a second plurality of programming signals at the resistive memory elements of junctions 230. The second plurality of programming signals may define a number of values within the second matrix. In some examples, the second matrix corresponds to the image to be processed. The programming signal may be, for example, a voltage, a current, an energy, or other form of electrical stimulus. To deliver the programming signals to the resistive memory elements of junctions 230, desired junctions may be activated by the delivery of a gate voltage to the transistors of the desired junctions. For example, the gate voltage may be delivered via a corresponding diagonal control line 250 to activate the transistors of the junctions 230 coupled to that diagonal control line 250.

In some examples, the second matrix may be converted into a plurality of vectors that represent portions of the second matrix. Doing so allows the crossbar array 200 to perform vector-matrix multiplication. For example, vector values from the second matrix can be passed in parallel into each row of the crossbar array 200.

As a result, crossbar array 200 may output a plurality of collected currents from the resistive memory elements from their respective column lines 220. The collected currents may define the matrix multiplication of the first matrix and the second matrix. For example, when the second plurality of programming signals passes through crossbar array 200, the programming signals are modified by the resistance states of the resistive memory elements, which may be set by the first plurality of programming signals. As a result, the collected currents are a result of the matrix multiplication of the first matrix and the second matrix.

In some examples, the first matrix may have dimensions of (a, b), and second matrix may have dimensions of (c, d). In such instances, crossbar array 200 may comprise a number of row lines 210 equaling to a*b to (a+c−1)*(b+d−1). Crossbar array 200 may have a number of column lines 220 equaling to (a+c−1)*(b+d−1). Furthermore, in such examples, crossbar array 200 may have a number of junctions 230 equal to a*b*c*d. With such dimensions, crossbar array 200 may be able to calculate matrix multiplication of any first matrix equal in size or smaller than (a, b) and any second matrix equal in size or smaller than (c, d).

In some examples, such as the one illustrated in FIG. 2, crossbar array 200 may have a plurality of sub-arrays arranged diagonally. Each sub-array may be defined by a subset 210A of row lines 210 and a subset 220A of column lines 220. In some examples, crossbar array 200 may have b*d number of sub-arrays.

In some examples, subset 210A of row lines may include (a) row lines, and subset 220A of column lines may include a+c−1 number of column lines. Each sub-array may have a*c number of junctions 230. In some examples, sub-arrays may be arranged so that (d) number of sub-arrays are aligned in a row, and the crossbar array may have (b) number of rows of sub-arrays. Furthermore, in some examples, crossbar array 200 may have a plurality of diagonal control lines 250 equaling to b*c.

Figure 3:
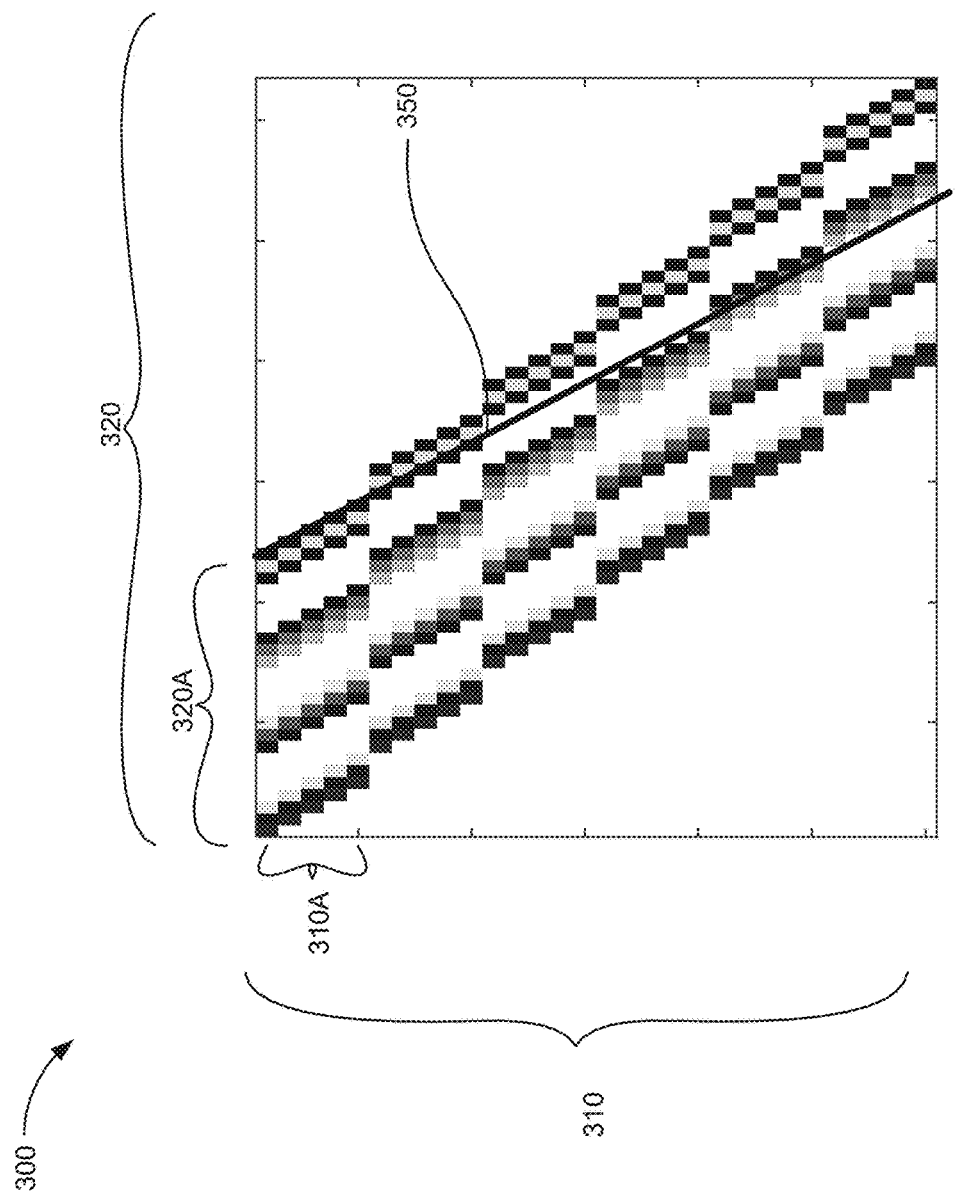
FIG. 3 is a diagram illustrating an example matrix mapping of a first matrix and a second matrix onto a crossbar array.

FIG. 3 illustrates, in further detail, a matrix mapping 300 of junctions in a crossbar array according to the dimensions of a first matrix and a second matrix. In the example shown in FIG. 3, a first matrix may have dimensions of (5, 6). A second matrix may have dimensions of (3, 4). When mapped onto matrix mapping 300, a crossbar array to calculate the multiplication of the first matrix and the second matrix may have 30 row lines 310, 63 column lines 320, and 18 diagonal control lines 350. The crossbar array may have 360 total junctions.

The crossbar array may have 6 (b) sub-arrays, as defined by rows 310A and columns 320A. Within each sub-array contains 4 (d) number of clusters of junctions. The positions of the sub-arrays may be staggered so that sub-arrays are shifted left or right by the size of a cluster of junctions. Each sub-array may have 5 row lines and 28 column lines. Each cluster of junctions may be further divided into 5 subsets of three junctions for a total of 15 junctions in each cluster. The 5 subsets may be aligned adjacent to each other by the row lines, and their position may be staggered so that subsets in adjacent column lines are shifted left or right by one.

Diagonal control lines 350 connect junctions by a diagonal line. Due to the staggered structure of the crossbar array, the crossbar array may have a total of 18 (b*c) diagonal control lines 350.

Figure 4:
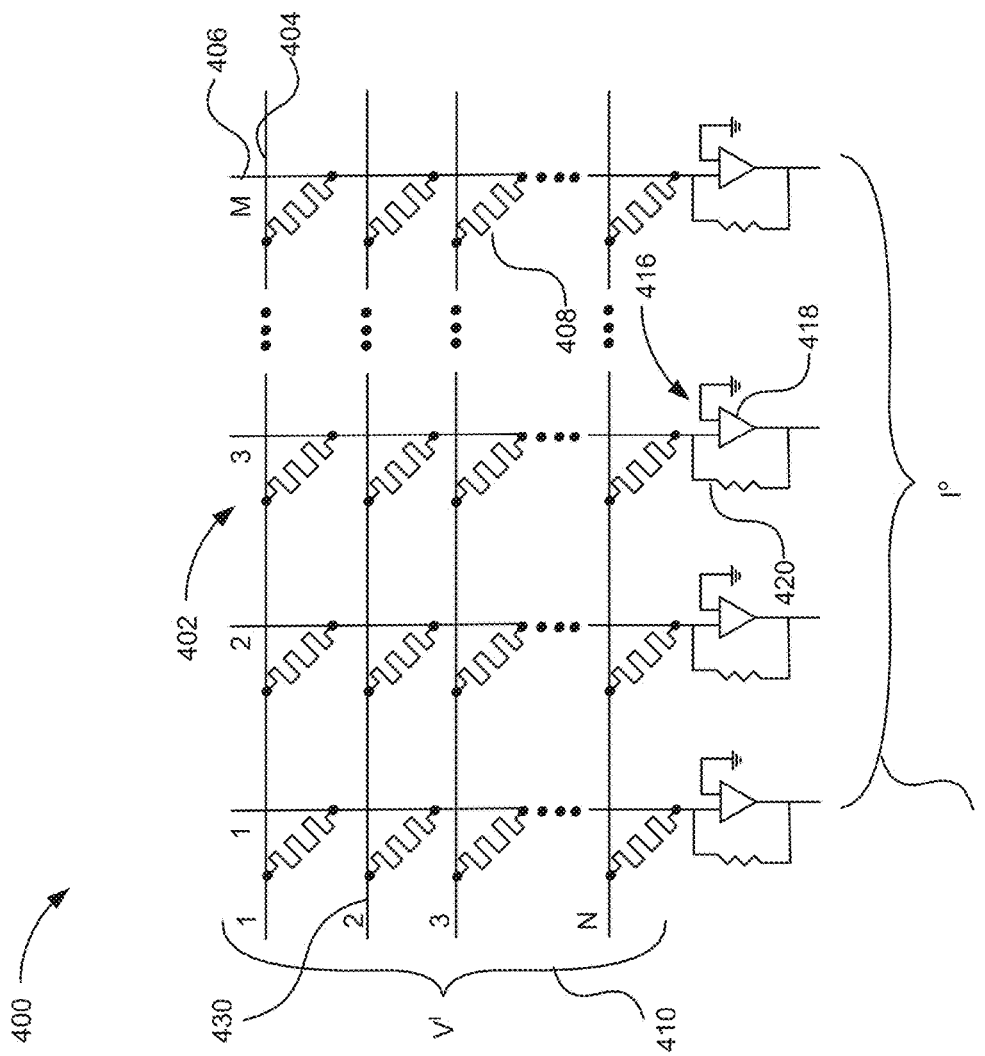
FIG. 4 is a diagram of an example image processor with a crossbar array illustrating programming signal inputs and collected current outputs.

FIG. 4 illustrates an image processor 400 with example memory crossbar array 402 illustrating programming signal inputs 410 and collected current outputs 414, where the memory crossbar array may function as a an image processor 400. Image processor 400 may include N row electrodes 404 and M column electrodes 406. The crossbar junctions throughout crossbar array 402 may include a memory cell 408, which may be analogous to junction 130 or junction 230. Memory crossbar array 402 may include programming signal inputs 410 for applying programming signals, such as voltages, to row electrodes 404, and memory crossbar array 402 may include collected current outputs 414 for receiving output voltages resulting from current flows in column electrodes 406. Image processor 400 may also include sense circuitry 416 for converting an electrical current in a column electrode 406 to a voltage. In an example of the principles described herein, sense circuitry 416 may include an operational amplifier 418 and a resistor 420, which can be arranged to represent a virtual ground for read operations.

Image processor 400 may also include other peripheral circuitry associated with crossbar arrays 402 used as storage devices. For example, input 410 may include drivers connected to row electrodes 404. An address decoder can be used to select a row electrode 404 and activate a driver corresponding to the selected row electrode 404. The driver for a selected row electrode 404 can drive a corresponding row electrode 404 with different voltages corresponding to a matrix multiplication or the process of setting resistance values within memristive elements 408 of crossbar array 402. Similar driver and decoder circuitry may be included for column electrodes 406. Control circuitry may also be used to control application of voltages at the inputs and reading of voltages at the outputs of image processor 400. Digital to analog circuitry and analog to digital circuitry may be used at inputs 410 and at outputs 414. Input signals to row electrodes 404 and column electrodes 406 can be either analog or digital. The peripheral circuitry above described can be fabricated using semiconductor processing techniques in the same integrated structure or semiconductor die as crossbar array 402 in the above example. As described in further detail below, there are two main operations that occur during operation of the image processor. The first operation is to program the memristors in the crossbar array so as to map the mathematic values in an N×M matrix to the array. In an example, one memristor is programmed at a time during the programming operation. The second operation is the matrix multiplication operation. In this operation, input voltages are applied and output voltages obtained, corresponding to the result of multiplying an N×M, matrix by an N×1 vector. Multiple iterations of multiplying the matrix by the vector may result in a full matrix by matrix multiplication. The input voltages are below the programming voltages so the resistance values of the memristors in array 402 are not changed during the matrix multiplication operation.

In one example of image processor operation according to the principles described herein, vector and matrix multiplications may be executed through image processor 400 by applying a set of voltages $V^I$ 410 simultaneously along rows 404 of the N×M crossbar array 402 and collecting the currents through columns 406 and measuring output voltage $V^O$ 414. On each column, every input voltage 410 is weighted by the corresponding memristance $(1/G_{ij})$ and the weighted summation is reflected at the output voltage 414. Using Ohm's law, the relation between the input voltages 410 and output voltages 414 can be represented by a vector matrix multiplication of the form: $\{V^O\}^T = -\{V^h\}^T [G] R_S$, where $G_{ij}$ is an N×M matrix determined by the conductance (inverse of resistance) of crossbar array 402, $R_S$ is the resistance value of the sense amplifiers and T denotes the transpose of the column vectors $V^O$ and $V^I$. The negative sign follows from use of a negative feedback operational amplifier in the sense amplifiers. From the foregoing, it follows that the image processor engine 400 can be utilized for multiplying a first vector of values $\{b_i\}^T$ by a matrix of values $[a_{ij}]$ to obtain a second vector of values $\{c_j\}^T$, where i=1, N and j=1, M. The vector operation can be set forth in more detail as follows.

$$a_{11}b_1 + a_{21}b_2 + \ldots + a_{N1}b_N = c_1$$
$$\ldots$$
$$a_{1M}b_1 a_{2M}b_2 + \ldots + a_{NM}b_N = c_M.$$

The vector processing or multiplication using the principles described herein generally starts by mapping a matrix of values $[a_{ij}]$ onto crossbar array 402 or, stated otherwise, programming—e.g., writing—conductance values $G_{ij}$ into the crossbar junctions of the array 402.

With reference still to FIG. 4, in one example, each of the conductance values $G_{ij}$ is set by sequentially imposing a voltage drop over each of the crossbar junctions (FIG. 1, 130). For example, the conductance value $G_{2,3}$ may be set by applying a voltage equal to $V_{Row2}$ at the $2^{nd}$ row of crossbar array 402 and a voltage equal to $V_{Col3}$ at the $3^{rd}$ column of the array. Referring to FIG. 4, in one example, the voltage input, $V_{Row2}$, may be applied to the $2^{nd}$ row at a location 430 occurring at the $2^{nd}$ row electrode adjacent the j=1 column electrode. The voltage input, $V_{Col3}$, will be applied to the $3^{rd}$ column electrode adjacent either the i=1 or i=N location. Note that when applying a voltage at a column electrode 406, the sense circuitry 416 for that electrode may be switched out and a voltage driver switched in. The voltage difference $V_{Row2}-V_{Col3}$ will generally determine the resulting conductance value $G_{2,3}$ based on the characteristics of the memristive element 408 located at the intersection. When following this approach, the unselected columns 406 and rows 404 may be addressed according to one of several schemes, including, for example, floating all unselected columns 406 and rows 404 or grounding all unselected columns and rows. Other schemes involve grounding columns 406 or grounding partial columns 406. Grounding all unselected columns and rows is beneficial in that the scheme helps to isolate the unselected columns and rows to minimize the sneak path currents to the selected output column 406. Following programming, operation of image processor 400 proceeds by applying the input voltages 410 and reading the output voltages 414.

In accordance with one example of the principles disclosed herein, the memristors used for the image processor 400 may have linear current-voltage relation. Linear current-voltage relations permit higher accuracy in the matrix multiplication process. However, crossbar arrays 402 having linear memristors are prone to having large sneak path currents during programming of the array 402, particularly when the size of crossbar array 402 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths. To alleviate the sneak path currents in such instances, and especially when larger arrays are desired, an access device, such as a transistor or non-linear selector, may be incorporated within or utilized together with a memristor to minimize the sneak path currents in the array. More specifically, memory cell should be broadly interpreted to include memristive devices including, for example, a resistive memory element, a memristor, a memristor and a transistor, a memristor and a selector, or a memristor and other components. For example, the memory cell may include a memristor coupled in series with a transistor.

Figure 5:
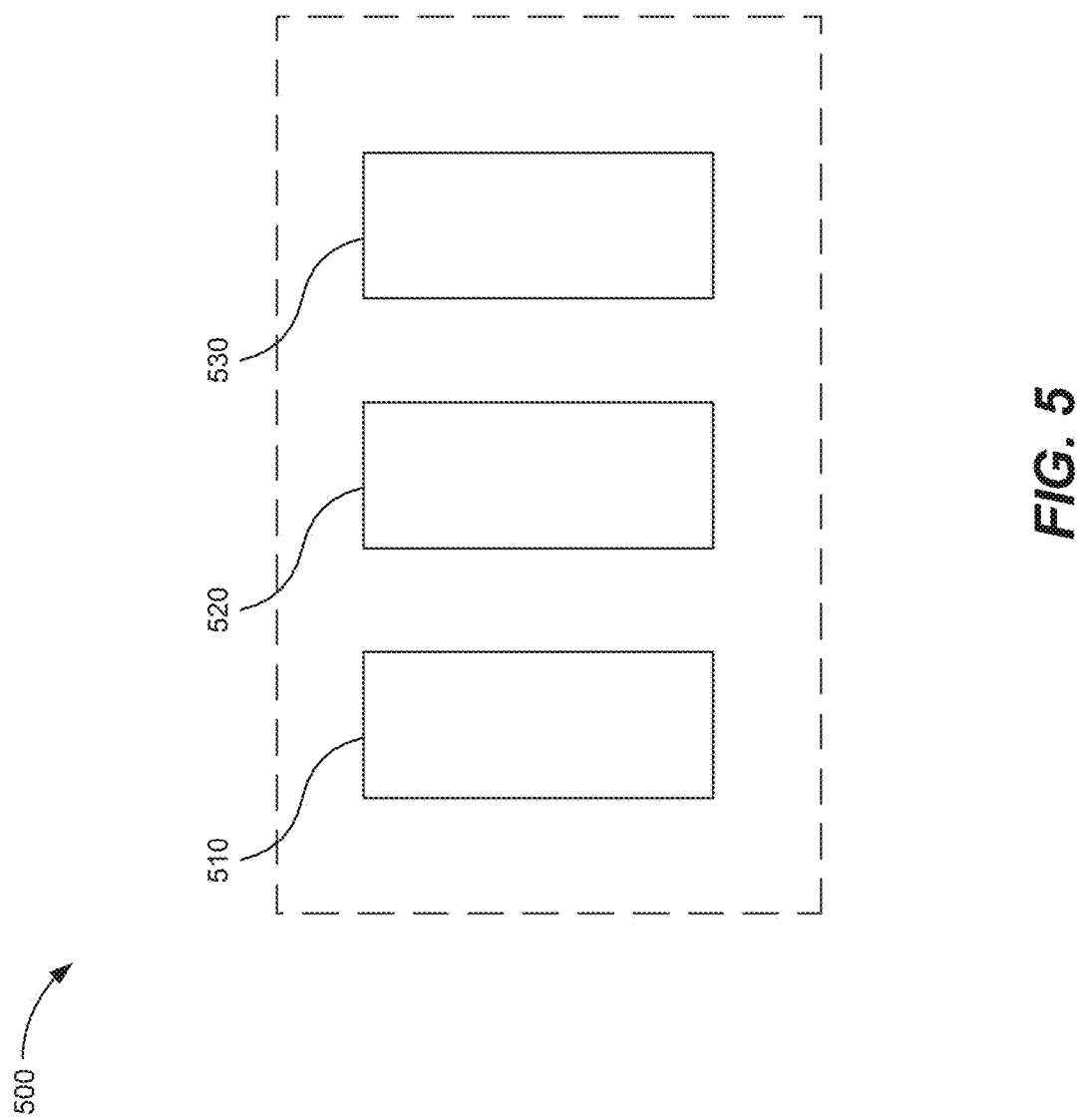
FIG. 5 is a block diagram of an example computing device having an image processing accelerator.

FIG. 5 illustrates a block diagram of an example computing device 500 having an image processing accelerator. Computing device 500 may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein. In the example shown in FIG. 5, computing device 500 includes a processor 510, an image processing accelerator 520, and a convolution engine 530. The dashed border around computing device 500 illustrates that the components may be located separately and may be connected, such as via a network.

Processor 510 may be central processing units (CPUs), semiconductor-based microprocessors, or other hardware devices suitable for retrieval and execution of instructions. Processor 510 may execute instructions to perform some or all of the processes described herein.

Image processing accelerator 520 may be analogous to image processor 400 of FIG. 3 and may perform convolution of an image and a kernel faster than is possible in software running on a more general-purpose processing device. Although image processing accelerator 520 is depicted as being a device internal to the computing device 500, in other examples, the image processing accelerator 520 may be a peripheral device coupled to the computing device 500 or included within a peripheral device coupled to the computing device 500.

Image processing accelerator 500 may include a plurality of row lines analogous to row lines 210, a plurality of column lines analogous to column lines 220, a plurality of junctions analogous to junctions 230, and a plurality of diagonal control lines analogous to diagonal control lines 250. Image processing accelerator 500 may calculate a convolution of a two-dimensional image and a two-dimensional kernel. Image processing accelerator 500 may do so by calculating a matrix multiplication of a first matrix that corresponds to the image and of a second matrix that corresponds to the kernel. In some examples, junctions may be positioned so that they couple intersections of row lines and column lines in a manner that allows image processing accelerator 500 to calculate the matrix multiplication of the first matrix and the second matrix.

Convolution engine 530 may represent any combination of hardware and programming. For example, the programming for convolution engine 530 may be processor executable instructions stored on a non-transitory machine-readable storage medium and the hardware for the engines may include processor 510 or another processor, to execute those instructions. In addition or as an alternative, convolution engine 530 may include one or more hardware devices including electronic circuitry for implementing the functionality described below.

To calculate the matrix multiplication, convolution engine 530 may deliver a gate voltage to one of the plurality of diagonal control lines of image processing accelerator 520. The gate voltage may activate the transistors of the junctions coupled to one of the plurality of diagonal control lines, allowing programming of the resistive memory elements of those junctions. In some examples, the gate voltage may instead be another form of electrical stimulus, such as another voltage, a current, or an energy.

Further, convolution engine 530 may deliver a first plurality of programming signals at the resistive memory elements. The first plurality of programming signals may define a number of values to be applied to the resistive memory elements. In some examples, the first matrix corresponds to the kernel for processing the image. For example, the kernel matrix may be useful for blurring, sharpening, embossing, edge-detection, and other image processes. The first plurality of programming signals may write the resistive memory elements to a certain state to correspond to certain values in the kernel matrix. For example, a resistive memory element may be set to a plurality of resistance states. Driving an input current, such as by applying a voltage defined by the second matrix, across the crossbar array could transform the input current to an output current.

Additionally, convolution engine 530 may deliver a second plurality of programming signals at the resistive memory elements of the junctions of image processing accelerator 520. The second plurality of programming signals may define a number of values within the second matrix. In some examples, the second matrix corresponds to the image to be processed. The programming signal may be, for example, a voltage, a current, an energy, or other form of electrical stimulus.

As a result, convolution engine 530 may collect a plurality of collected currents from the resistive memory elements from their respective column lines. The collected currents may define the matrix multiplication of the first matrix and the second matrix. For example, when the first plurality of programming signals passes image processing accelerator 520, the programming signals are modified by the resistance states of the resistive memory elements, which may be set by the first plurality of programming signals. As a result, the collected currents are a result of the matrix multiplication of the first matrix and the second matrix. The matrix multiplication of the first matrix and the second matrix may define the convolution of the image and the kernel.

Figure 6:
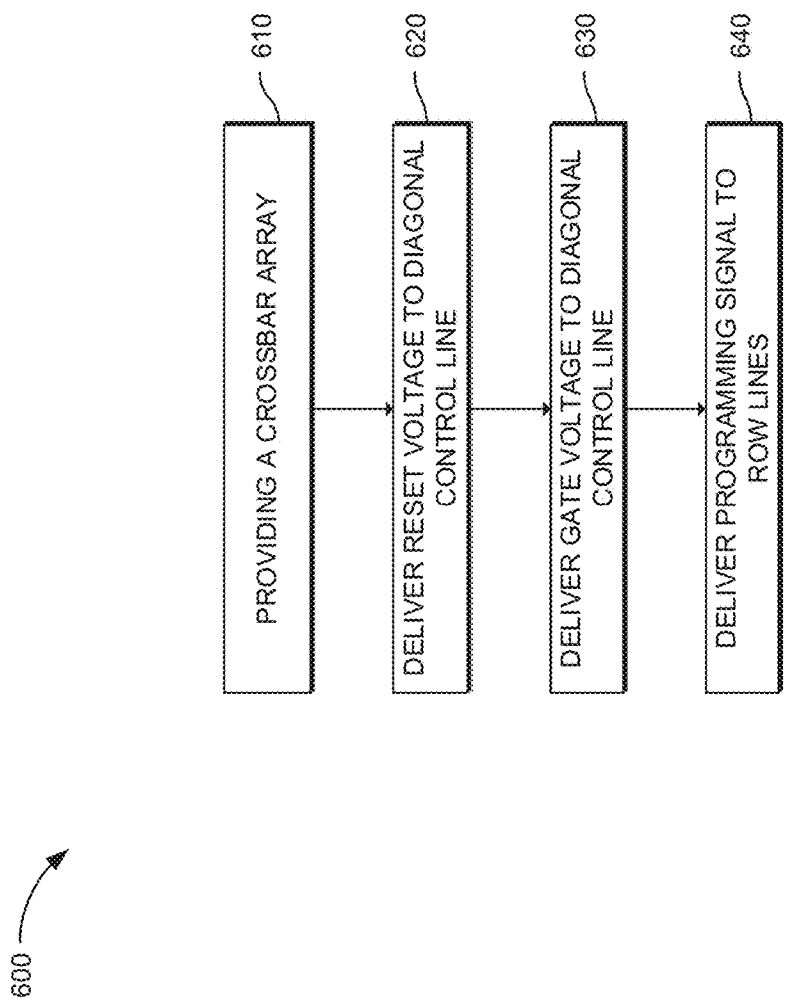
FIG. 6 is a flowchart of an example method for programming a memory cell.

FIG. 6 is a flowchart showing an example method 600 for programming a crossbar array. Method 600 may include operation 610 for providing a crossbar array, operation 620 for delivering a reset voltage to a diagonal control line of the crossbar array, operation 630 for delivering a gate voltage to the diagonal control line of the crossbar array, and operation 640 for delivering a programming signal to a subset of row lines of a plurality of row lines of the crossbar array. Although execution of method 600 is herein described in reference to crossbar array 200 of FIG. 2, other suitable examples of method 600 should be apparent, including the examples provided in FIG. 1-5.

In an operation 610, a crossbar array may be provided. The crossbar array may be analogous to crossbar array 200 and may include a plurality of row lines analogous to row lines 210, a plurality of column lines analogous to column lines 220, a plurality of memory cells having a resistive memory element and a transistor analogous to junctions 230, and a plurality of diagonal control lines analogous to diagonal control lines 250. The memory cells may be positioned so that the crossbar array may be used to calculate a matrix multiplication of a first matrix and a second matrix.

In an operation 620, a reset voltage may be delivered to a diagonal control line of the plurality of diagonal control lines of the crossbar array. The reset voltage may reset the resistive memory elements, which may mean switching the resistive memory element to a default state, which may be defined as on or off. For example, the resistive memory element may have threshold voltage, which is the minimum voltage for switching the resistive memory element. The reset voltage may be greater than the threshold voltages of the resistive memory elements of all of the memory cells in the diagonal. Therefore the reset voltage may switching (reset) all of the memory cells in the diagonal. The reset voltage may also be larger than a gate voltage of the transistors of the memory cells. Accordingly, the reset voltage may be able to activate the transistors in order to access the memory elements coupled to the transistors. In some examples, the reset voltage may instead be another form of electrical stimulus, such as another voltage, a current, or an energy.

In an operation 630, a gate voltage may be delivered to the diagonal control line which was delivered the reset voltage in operation 620. The gate voltage may activate the transistors of the memory cells coupled to the diagonal control line, allowing programming of the resistive memory elements of those junctions. In some examples, the gate voltage may instead be another form of electrical stimulus, such as another voltage, a current, or an energy.

In an operation 640, a programming signal may be delivered to a subset of row lines of the plurality of row lines of the crossbar array. As described in reference to FIG. 3, the crossbar array may have a plurality of sub-arrays. The row lines of a sub-array may be the subset of row lines as referenced here. When a matrix is mapped onto the sub-array, each memory cell on the same diagonal within a sub-array may be mapped to the same value. Accordingly the programming signal may program each memory cell on the same diagonal to the same value. Therefore, one programming signal value may be used each row line of the subset of row lines.

For example, as illustrated in reference to previous figures, a first plurality of programming signals may be delivered to the row lines of the crossbar array. The first plurality of programming signals may define a number of values to be applied to the resistive memory elements. In some examples, the first matrix corresponds to a kernel for convoluting the image. For example, the kernel matrix may be useful for blurring, sharpening, embossing, edge-detection, and other image processes. The first plurality of programming signals may program the resistive memory elements of the memory cells to a certain state to correspond to certain values in the first matrix. For example, a resistive memory element may be set to a plurality of resistance states. Driving an input current, such as by applying a voltage defined by a second matrix, across the crossbar array could transform the input current to an output current.

Once the crossbar array has been programed, further operations may be executed to perform matrix multiplication. For example, a second plurality of programming signals may define a number of values within a second matrix. In some examples, the second matrix corresponds to an image to which convolution is to be performed. The programming signal may be, for example, a voltage, a current, an energy, or other form of electrical stimulus.

As a result, a plurality of collected currents may be collected from the resistive memory elements from their respective column lines. The collected currents may define the matrix multiplication of the first matrix and the second matrix. For example, when the second plurality of programming signals passes the crossbar array, the programming signals are modified by the resistance states of the resistive memory elements, which may be set by the first plurality of programming signals. As a result, the collected currents are a result of the matrix multiplication of the first matrix and the second matrix. The matrix multiplication of the first matrix and the second matrix may define the convolution of the image and the kernel.

The foregoing describes a number of examples for crossbars arrays for calculating matrix multiplication and their applications. It should be understood that the examples described herein may include additional components and that some of the components described herein may be removed or modified without departing from the scope of the examples or their applications. It should also be understood that the components depicted in the figures are not drawn to scale, and thus, the components may have different relative sizes with respect to each other than as shown in the figures.

It should be noted that, as used in this application and the appended claims, the singular forms "a," "an," and "the" include plural elements unless the context clearly dictates otherwise.

The invention claimed is:

1. A crossbar array, comprising:
a plurality of row lines;
a plurality of column lines intersecting the plurality of row lines at a plurality of intersections;
a plurality of junctions coupled between the plurality of row lines and the plurality of column lines at a portion of the plurality of intersections; and
a plurality of diagonal control lines coupled to the plurality of junctions, wherein:
each junction comprises a resistive memory element and a transistor; and
the junctions are positioned to calculate a matrix multiplication of a first matrix and a second matrix,
wherein the crossbar array is to:
receive a gate voltage at one of the plurality of diagonal control lines to activate the transistors of the junctions coupled to the one of the plurality of diagonal control lines;
receive a first plurality of programming signals at the resistive memory elements, wherein the first plurality of programming signals define a number of values to be applied to the resistive memory elements;
receive a second plurality of programming signals at the resistive memory elements, wherein the second plurality of programming signals define a number of values within the first matrix; and
output a plurality of collected currents from the resistive memory elements from their respective column lines, wherein the collected currents define the matrix multiplication of the first matrix and the second matrix.

2. The crossbar array of claim 1, wherein the first matrix corresponds to a two-dimensional image, and the second matrix corresponds to a two-dimensional kernel.

3. The crossbar array of claim 2, wherein the crossbar array is to calculate a convolution of the two-dimensional image and the two-dimensional kernel.

4. The crossbar array of claim 1, wherein:
the first matrix has dimensions of a and b;
the second matrix has dimensions of c and d;
the plurality of row lines comprises a*b row lines;
the plurality of column lines comprises (a+c−1)*(b+d−1) column lines; and
the plurality of junctions comprises a*b*c*d junctions.

5. The crossbar array of claim 4, wherein the plurality of diagonal control lines comprises b*c diagonal control lines.

6. The crossbar array of claim 1, wherein some of the intersections do not comprise a junction.

7. The crossbar array of claim 1, wherein the resistive memory element comprises a memristor.

8. An image processor, comprising a crossbar array for calculating a convolution of an image and a kernel, the crossbar array comprising
a plurality of row lines;
a plurality of column lines intersecting the plurality of row lines at a plurality of intersections;
a plurality of junctions coupled between the plurality of row lines and the plurality of column lines at a portion of the plurality of intersections;
a plurality of diagonal control lines coupled to the plurality of junctions,
wherein each junction comprises a resistive memory element and a transistor;
and the junctions are positioned to calculate a matrix multiplication of a first matrix corresponding to the image and a second matrix corresponding to the kernel, and
wherein the image processor further comprises circuitry to:
deliver a gate voltage to one of the plurality of diagonal control lines to activate the transistors of the junctions coupled to the one of the plurality of diagonal control lines;
deliver a first plurality of programming signals to the resistive memory elements, wherein the first plurality of programing signals define a number of values to be applied to the resistive memory elements;
deliver a second plurality of programming signals to the resistive memory elements, wherein the second plurality of programming signals define a number of values within the first matrix; and
output a plurality of collected currents from the resistive memory elements from their respective column lines, wherein the collected currents define the matrix multiplication of the first matrix and the second matrix.

9. The image processor of claim 8, wherein the matrix multiplication of the first matrix and the second matrix defines the convolution of the image and the kernel.

10. The image processor of claim 8, wherein:
the first matrix has dimensions of a and b;
the second matrix has dimensions of c and d;
the plurality of row lines comprises a*b row lines;
the plurality of column lines comprises (a+c−1)*(b+d−1) column lines;
the plurality of junctions comprises a*b*c*d junctions; and
the plurality of diagonal control lines comprises b*c diagonal control lines.

11. A method for programming a memory cell, comprising:
providing a crossbar array, wherein the crossbar array comprises:
a plurality of row lines;
a plurality of column lines intersecting the plurality of row lines at a plurality of intersections;
a plurality of memory cells comprising a resistive memory element and a transistor coupled between the plurality of row lines and the plurality of column lines at a portion of the plurality of intersections,
wherein the memory cells are positioned to calculate a matrix multiplication of a first matrix and a second matrix; and a plurality of diagonal control lines coupled to the plurality of junctions;

delivering a gate voltage to one of the plurality of diagonal control lines to activate the transistors of the memory cells coupled to the one of the plurality of diagonal control lines; and delivering a programming signal to a subset of row lines of the plurality of row lines to program the memory cells coupled to the subset of row lines and the one of the plurality of diagonal control lines.

12. The method of claim 11, further comprising delivering a reset voltage to the one of the plurality of diagonal control lines to reset the resistive memory elements of the memory cells coupled to the one of the plurality of diagonal control lines, and wherein:

the gate voltage is to enforce a target current compliance for memory cells coupled to the subset of row lines of the plurality of row lines and the one of the plurality of diagonal control lines; and the programming signal is to program the memory cells coupled to the subset of row lines and the one of the plurality of diagonal control lines to a desired state.

13. The method of claim 11, wherein:

the first matrix has dimensions of a and b;

the second matrix has dimensions of c and d;

the plurality of row lines comprises a*b row lines;

the plurality of column lines comprises (a+c−1)*(b+d−1) column lines;

the plurality of junctions comprises a*b*c*d junctions; and the plurality of diagonal control lines comprises b*c diagonal control lines.

* * * * *